(12) United States Patent
Kim

(10) Patent No.: US 8,830,768 B2
(45) Date of Patent: Sep. 9, 2014

(54) DATA SENSING CIRCUIT AND MEMORY DEVICE INCLUDING THE SAME

(75) Inventor: Kwang-Seok Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 27 days.

(21) Appl. No.: 13/605,818

(22) Filed: Sep. 6, 2012

(65) Prior Publication Data
US 2013/0155786 A1 Jun. 20, 2013

(30) Foreign Application Priority Data
Dec. 14, 2011 (KR) ........................ 10-2011-0134495

(51) Int. Cl.
*G11C 7/06* (2006.01)

(52) U.S. Cl.
USPC ...... 365/189.07; 365/149; 365/207; 365/105; 365/210

(58) Field of Classification Search
USPC .................................. 365/189, 203, 196, 207
See application file for complete search history.

(56) References Cited

U.S. PATENT DOCUMENTS

| 7,272,059 | B2 * | 9/2007 | Vimercati et al. ............ 365/203 |
| 2003/0026120 | A1 | 2/2003 | Scheuerlein |
| 2009/0067218 | A1 * | 3/2009 | Graber ......................... 365/149 |
| 2010/0182843 | A1 | 7/2010 | Tang |

* cited by examiner

*Primary Examiner* — Hoai V Ho
*Assistant Examiner* — Muhammad Islam
(74) *Attorney, Agent, or Firm* — IP & T Group LLP

(57) ABSTRACT

A data sensing circuit includes: a current source configured to supply a reference current to an output line; a switching precharging unit configured to couple an input line with the output line during a precharge operation of the input line; and a current sinking unit configured to sink a current from the output line in response to a voltage level of the input line.

17 Claims, 5 Drawing Sheets

DATA SENSING CIRCUIT AND MEMORY DEVICE INCLUDING THE SAME

CROSS-REFERENCE TO RELATED APPLICATIONS

The present application claims priority of Korean Patent Application No. 10-2011-0134495, filed on Dec. 14, 2011, which is incorporated herein by reference in its entirety.

BACKGROUND

1. Field

Exemplary embodiments of the present invention relate to a data sensing circuit and a memory device including the same.

2. Description of the Related Art

Memory devices and diverse integrated circuits use a data sensing circuit for sensing data. Here, the data sensing circuit is a circuit that senses a small voltage difference between logic high and logic low levels of data.

FIG. 1 is a circuit diagram illustrating a data sensing circuit, such as a bit line sense amplifier, used in a conventional memory device.

When a data is read out of a memory cell 101, the voltage level of a bit line BL is changed based on the read data. Since the change in the voltage level of the bit line BL may be too small to be detected, the voltage level of the bit line BL is amplified in a bit line sense amplifier 110. A precharger 120 shown in the drawing is a structure for precharging bit lines BL and /BL to the level of a precharge voltage VBLP before a data is loaded on the bit lines BL and /BL.

The bit line sense amplifier 110 may include a latch circuit for amplifying the voltage difference between the pair of the bit lines BL and /BL. The latch circuit includes two inverters 111 and 112. A pull-up voltage (which is generally a power supply voltage VDD or a core voltage VCORE) is supplied to a pull-up voltage supply terminal RTO and a pull-down voltage (which is generally a ground voltage VSS) is supplied to a pull-down voltage supply terminal SB during a data sensing operation of the bit line sense amplifier 110. The pair of the inverters 111 and 112 receive the pull-up and pull-down voltages and amplify the voltage difference between the pair of the bit lines BL and /BL.

For example, when the voltage level of the bit line BL is a little higher than the voltage level of the bit line bar /BL, the bit line sense amplifier 110 amplifies the voltage level of the bit line BL to a pull-up voltage level, while amplifying the voltage level of the bit line bar /BL to a pull-down voltage level. Conversely, when the voltage level of the bit line bar /BL is a little higher than the voltage level of the bit line BL, the bit line sense amplifier 110 amplifies the voltage level of the bit line bar /BL to a pull-up voltage level, while amplifying the voltage level of the bit line BL to a pull-down voltage level.

In order to accurately sense a data loaded on the pair of the bit lines BL and /BL, PMOS transistors and NMOS transistors that constitute the bit line sense amplifier 110 are to be fabricated under the same processing conditions. However, it is difficult to maintain the processing conditions the same and the transistors may be fabricated to have different characteristics from each other.

Therefore, the transistors of conventional bit line sense amplifiers may have offset features and in order to address the offset features, a method of increasing the capacitance of a memory cell or a method of increasing the voltage level of the driving voltage of the bit line sense amplifier has been introduced. However, the method of increasing the capacitance of a memory cell increases the area of a circuit, and the method of increasing the voltage level of the driving voltage of the bit line sense amplifier increases current consumption.

SUMMARY

Exemplary embodiments of the present invention are directed to providing a data sensing circuit occupying relatively small area without offset features.

In accordance with an exemplary embodiment of the present invention, a data sensing circuit includes a current source configured to supply a reference current to an output line; a switching precharging unit configured to couple an input line with the output line during a precharge operation of the input line; and a current sinking unit configured to sink a current from the output line in response to a voltage level of the input line.

In accordance with another exemplary embodiment of the present invention, a data sensing circuit includes an input line; an output line, a first transistor configured to couple the input line with the output line in response to a precharge signal, and a second transistor configured to have a gate coupled with the input line and form a current path between the output line and a sinking end.

In accordance with yet another exemplary embodiment of the present invention, a bit line sense amplifier includes a current source configured to supply a reference current to an output line, a switching unit configured to couple a bit line with the output line during a precharge operation of the bit line; and a current sinking unit configured to sink a current from the output line in response to a voltage level of the bit line.

In accordance with still another exemplary embodiment of the present invention, a memory device includes' a memory cell; a bit line onto which a data of the memory cell is loaded; a current source configured to supply a reference current to an output line; a switching unit configured to couple the bit line with the output line during a precharge operation of the bit line; a current sinking unit configured to sink a current from the output line in response to a voltage level of the bit line; and a comparison unit configured to compare a voltage level of the output line with a voltage level of the reference current and drive a data bus.

In accordance with still another exemplary embodiment of the present invention, a data sensing circuit includes: a current source configured to supply a reference current to an output line; a current sinking unit configured to sink a current from the output line in response to a voltage level of the input line; a comparison unit configured to compare a voltage level of the output line with a voltage level of the reference current and drive a data bus; and a switching unit configured to transfer a voltage of the data bus to the input line during a precharge operation of the input line.

DETAILED DESCRIPTION

Figure 1:
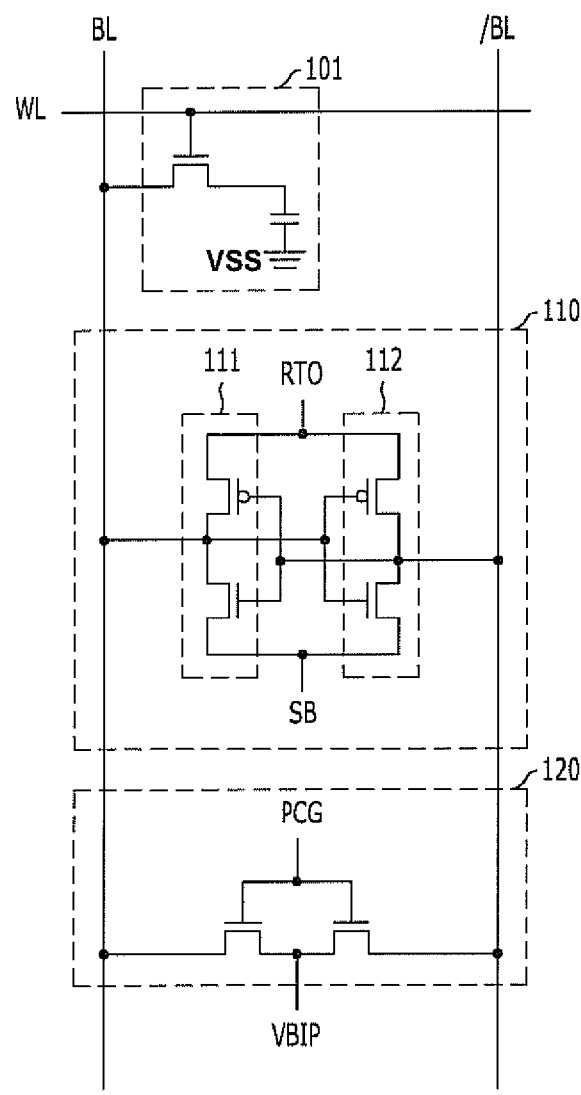
FIG. 1 is a circuit diagram illustrating a data sensing circuit used in a conventional memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
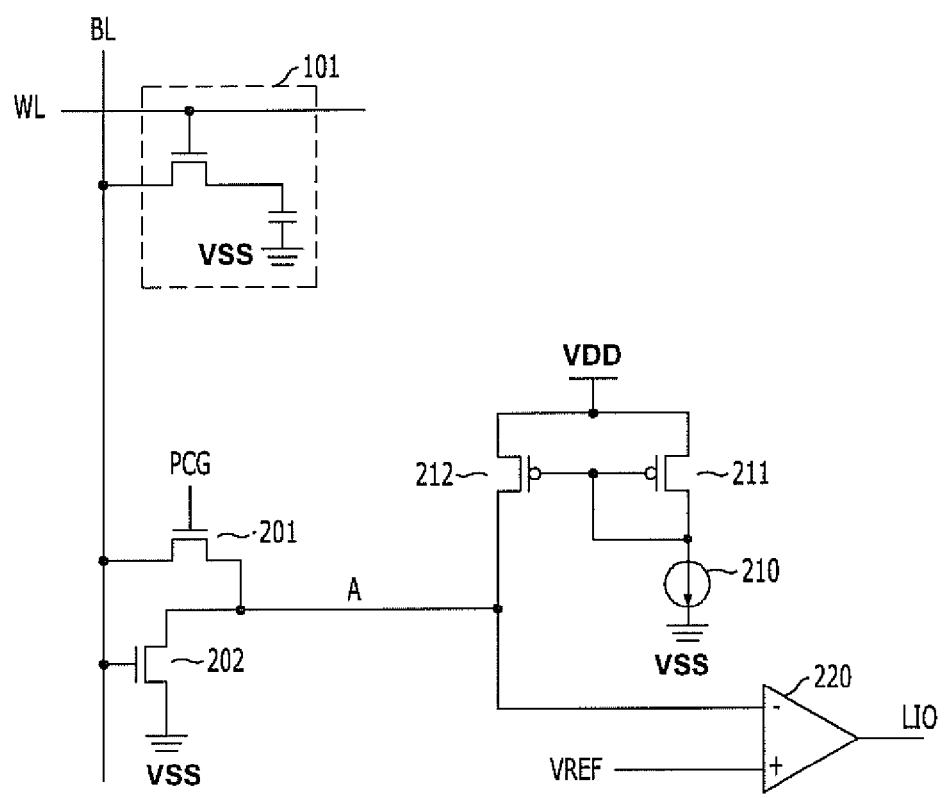
FIG. 2 is a circuit diagram illustrating a data sensing circuit in accordance with an exemplary embodiment of the present invention.

FIG. 2 is a circuit diagram illustrating a data sensing circuit in accordance with an exemplary embodiment of the present invention. FIG. 2 illustrates a bit line sense amplifier for sensing data of a bit line BL in a memory device as an example of the data sensing circuit.

Referring to FIG. 2, the data sensing circuit in accordance with the exemplary embodiment of the present invention includes a switching unit 201, a current sinking unit 202, a current source 210, mirroring units 211 and 212, and a comparison unit 220.

The switching unit 201 couples an input line BL with an output line A during a precharge operation of the input line BL. A data of a memory cell 101 is inputted to the input line BL. The switching unit 201 may include an NMOS transistor which receives a precharge signal PCG through a gate and forms a channel between the input line BL and the output line A.

The current sinking unit 202 controls current sinking from the output line A to a sinking terminal, which is a ground VSS in this embodiment, in response to a voltage level of the input line BL. The current sinking unit 202 may include an NMOS transistor which receives signals from the input line BL through a gate and forms a channel between the output line A and a sinking terminal.

The current source 210 is a structure for supplying a predetermined amount of current to the output line A. The same amount of current as the amount of the current flowing from the current source 210 flows to the output line A by the mirroring units 211 and 212.

The comparison unit 220 compares the voltage level of the output line A with the level of a reference voltage VREF (VREF=VDD/2) and load a resultant data into a data bus LIO.

The data sensing operation performed in the data sensing circuit is divided into (1) an operation of precharging the input line BL before a data is loaded onto the input line BL and (2) an operation of sensing the data loaded onto the input line BL after a precharge operation. Hereafter, the data sensing operation of the data sensing circuit is described.

(1) Precharge Operation of Input Line BL

During a precharge operation of the input line BL, a precharge signal PCG is enabled into a logic high level and the switching unit 201 is turned on in response to the enabling of the precharge signal PCG. As a result, the input line BL and the output line A are electrically connected to each other. On the other hand, the current sinking unit 202 makes the current of the output line A sink to the ground in response to the voltage level of the input line BL. After the switching unit 201 is turned on and a certain period of time passes, the voltage levels of the output line A and the input line BL reach a balanced state where the voltage levels are not changed any more. In the balanced state, the voltage of the output line A becomes the same as the reference voltage VREF, and the voltage of the input line BL becomes a voltage level of the output line A when the amount of current sinking through the current sinking unit 202 and the amount of current supplied from the current source 210 to the output line A are the same.

At the end of the precharge operation, the balanced voltage level of the input line BL may be different depending on the characteristics of the current sinking unit 202. For example, as the threshold voltage of the current sinking unit 202 is higher, the balanced voltage level of the input line BL becomes higher. Also, as the threshold voltage of the current sinking unit 202 is lower, the balanced voltage level of the input line BL becomes lower. In other words, the precharge level of the input line BL may reflect the device characteristics of the current sinking unit 202 according to the embodiment of the present invention.

(2) Data Sensing Operation After Precharging of Input Line BL

When the precharge operation of the input line BL is completed, the precharge signal PCG is disabled into a logic low level, and the switching unit 201 is turned off, making the input line BL and the output line A electrically disconnected. A signal of a word line WL, then, is enabled and a transistor of a memory cell 101 is turned on and a data stored in a capacitor of the memory cell 101 is loaded onto the input line BL. If the data of a logic high level is loaded onto the input line BL, the voltage level of the input line BL is raised, and the current sinking unit 202 then increases the amount of current sinking to the ground to thereby make the voltage level of the output line A lower than the reference voltage VREF. Therefore, a data of a logic high level is sensed by the comparison unit 220. Also, if the data of a logic low level is loaded onto the input line BL, the voltage level of the input line BL is lowered, and the current sinking unit 202 then decreases the amount of current sinking to the ground to thereby make the voltage level of the output line A higher than the reference voltage VREF. Therefore, a data of a logic low level is sensed by the comparison unit 220.

According to the exemplary embodiment of the present invention, before a data is loaded onto the input line BL, the precharge level of the input line BL is decided based on the precharge operation result by reflecting the device characteristics of the current sinking unit 202. Also, since the voltage level of the input line BL varies depending on whether a data is loaded onto the input line BL or not and is sensed using the current sinking unit 202, an accurate data sensing operation may be carried out. In short, since the precharging and data sensing of the input line BL are performed by the same device, which is the current sinking unit 202, due to a device characteristic change occurring in the fabrication of the current sinking unit 202, the offset characteristics may be removed in an effective manner.

Although FIG. 2 illustrates a bit line sense amplifier of a memory device as an example of the data sensing circuit according to the exemplary embodiment of the present invention, it is not limited thereto. For example, the data sensing circuit according to the embodiment of the present invention may be used to sense the data inputted into all kinds of input lines.

Also, although FIG. 2 exemplarily illustrates a case where the switching unit 201 and the current sinking unit 202 include NMOS transistors, the switching unit 201 may be substituted with any other device turned on or off in response to a precharge signal and the current sinking unit 202 may be substituted with any other device changing the amount of current flowing therethrough in response to the voltage level of the input line. For example, a PMOS transistor may be used as the switching unit 201. In this case, the precharge signal is to be controlled to be enabled to a logic low level during a precharge operation. Also, a PMOS transistor may be used as the current sinking unit 202. In this case, the reference voltage VREF is inputted to a negative input terminal (−) of the comparison unit 220 while the output line A is coupled to a positive input terminal (+) of the comparison unit 220, on the contrary to those shown in FIG. 2.

Figure 3:
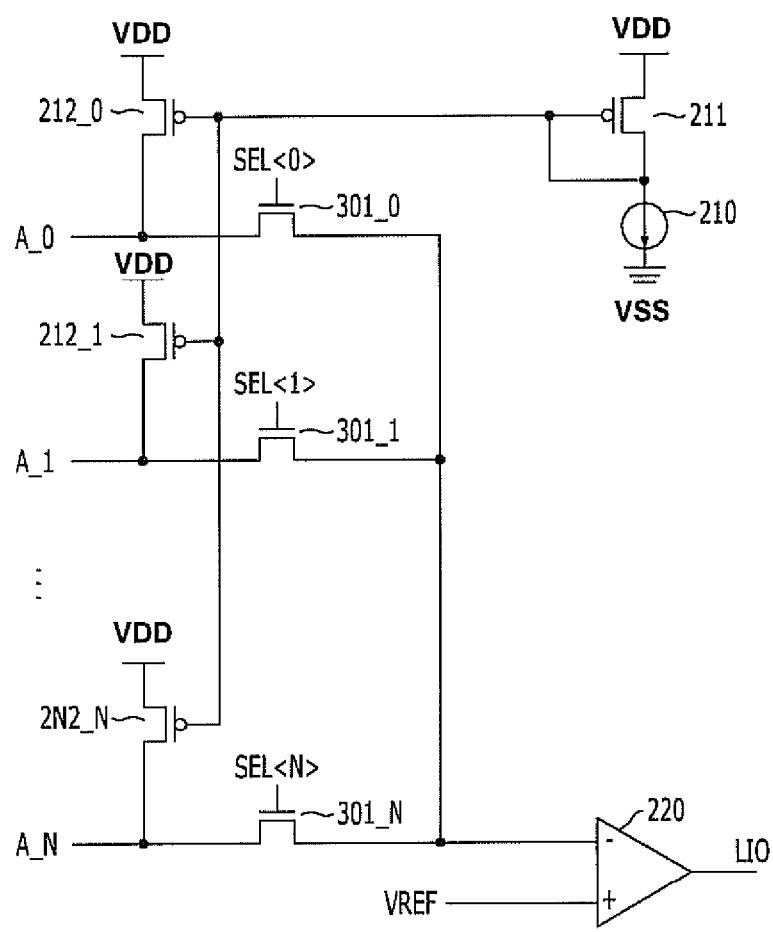
FIG. 3 is a circuit diagram illustrating a plurality of data sensing circuits sharing a current source 210 and a comparator 220.

FIG. 3 is a circuit diagram illustrating a plurality of data sensing circuits sharing a current source 210 and a comparator 220.

Lines A_0 to A_N each denotes the output lines of FIG. 2. That is, although omitted from FIG. 3, N+1 switching units and current sinking units may be further included. N+1 mirroring units 212_0 to 212_N supply the current of current source 210 to the output lines A_0 to A_N=.

Also, one comparison unit 220 may be shared by a plurality of data sensing circuits by selectively coupling one comparison unit 220 with one among the output lines A_0 to A_N through a plurality of selection switches 301_0 to 301_N. A selection signal SEL<0:L> is a signal for selecting an output line to be coupled with the comparison unit 220 among the output lines A_0 to A_N.

Through the method shown in FIG. 3 where the current source 210 and the comparison unit 220 are shared by a plurality of data sensing circuits, the plurality of data sensing circuits may occupy considerably small area.

Figure 4:
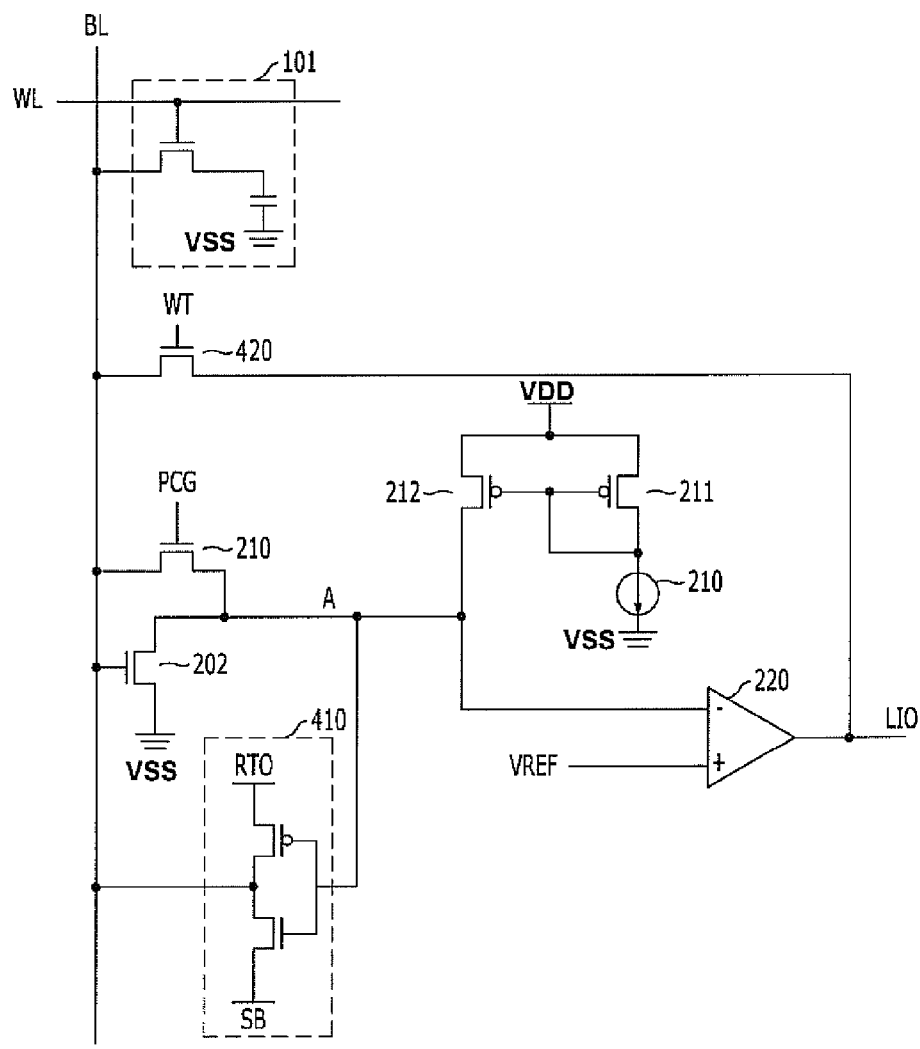
FIG. 4 is a circuit diagram illustrating a data sensing circuit of FIG. 2 with a structure for a refresh operation and a write operation of a memory added thereto.

FIG. 4 is a circuit diagram illustrating the data sensing circuit of FIG. 2 with a structure for a refresh operation and a write operation of a memory added thereto.

Referring to FIG. 4, the data sensing circuit may include a refresh operation unit 410 for performing a refresh operation and a write operation unit 420 for performing a write operation.

The refresh operation unit 410 controls the voltage of the input line BL in response to the voltage level of the output line A. When the voltage level of the output line A is increased, the voltage level of the input line BL is decreased, and when the voltage level of the output line A is decreased, the voltage level of the input line BL is increased. The refresh operation unit 410 may include an inverter. The refresh operation unit 410 may be enabled to inhibit the data sensing of the input line BL. Therefore, the refresh operation unit 410 may be controlled to be enabled after a certain time passes from the moment when the data sensing operation is initiated. For example, the data sensing circuit may be controlled to supply a pull-up voltage RTO and a pull-down voltage SB to the refresh operation unit 410 after a given time has passed since a data is loaded onto the input line BL.

The write operation unit 420 is a device for transferring a write data which is inputted to a data bus LIO to the input line BL. The write operation unit 420 may include a transistor that is turned on in response to a write signal WT. When a write data is loaded onto the a data bus LIO during a write operation, the write operation unit 420 is turned on to transfer the write data to the input line BL, and the data of the input line BL is written in a memory cell 101.

Figure 5:
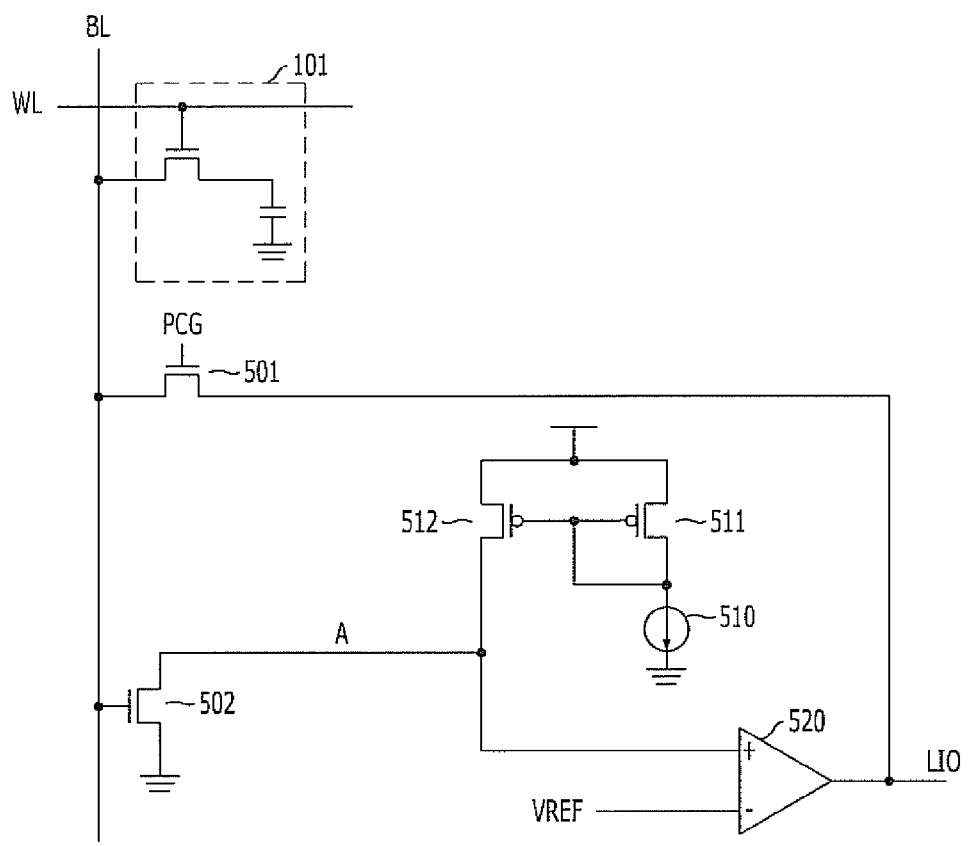
FIG. 5 is a circuit diagram illustrating a data sensing circuit in accordance with another exemplary embodiment of the present invention.

FIG. 5 is a circuit diagram illustrating a data sensing circuit in accordance with another exemplary embodiment of the present invention.

Referring to FIG. 5, the data sensing circuit in accordance with the exemplary embodiment of the present invention includes a switching unit 501, a current sinking unit 502, a current source 510, mirroring units 511 and 512, and a comparison unit 520.

The switching unit 501 couples a data bus LIO with an input line BL during a precharge operation. The switching unit 501 may include an NMOS transistor which receives a precharge signal PCG through a gate and forms a channel between the input line BL and the data bus LIO.

The current sinking unit 502 controls current sinking from the output line A to a sinking terminal, which is a ground in this embodiment, in response to a voltage level of the input line BL. The current sinking unit 502 may include an NMOS transistor which receives signals from the input line BL through a gate and forms a channel between the output line A and a sinking terminal.

The current source 510 is a structure for supplying a predetermined amount of current to the output line A. The same amount of current as the amount of the current flowing from the current source 510 flows to the output line A by the mirroring units 511 and 512.

The comparison unit 520 compares the voltage level of the output line A with the level of a reference voltage VREF (VREF=VDD/2) and load data into a data bus LIO.

The data sensing operation performed in the data sensing circuit is divided into (1) an operation of precharging the input line BL before a data is loaded onto the input line BL and (2) an operation of sensing the data loaded onto the input line BL after a precharge operation. Hereafter, the data sensing operation of the data sensing circuit is described.

(1) Precharge Operation of Input Line BL

During a precharge operation of the input line BL, a precharge signal PCG is enabled into a logic high level and the switching unit 501 is turned on in response to the enabling of the precharge signal PCG. As a result, the input line BL and the data bus LIO are electrically connected to each other. On the other hand, the current sinking unit 502 makes the current of the output line A sink to the ground in response to the voltage level of the input line BL. As the voltage level of the input line BL is higher, the voltage level of the output line A becomes lower, and as the voltage level of the input line BL is lower, the voltage level of the output line A becomes higher. Also, as the voltage level of the output line A is higher than the reference voltage VREF, the voltage level of the data bus LIO is increased, and as the voltage level of the output line A is lower than the reference voltage VREF, the voltage level of the data bus LIO is decreased. Therefore, the voltage level of the input line BL converges into the level of the reference voltage VREF.

(2) Data Sensing Operation After Precharging of Input Line BL

When the precharge operation of the input line BL is completed, the precharge signal PCG is disabled into a logic low level, and the switching unit 501 is turned off to thereby make the input line BL and the output line A electrically disconnected. A signal of a word line WL, then, is enabled and a transistor of a memory cell 101 is turned on and a data stored in a capacitor of the memory cell 101 is loaded onto the input line BL. If the data of a logic high level is loaded onto the input line BL, the voltage level of the input line BL is raised, and the current sinking unit 502 then increases the amount of current sinking to the ground to thereby make the voltage level of the output line A lower than the reference voltage VREF. Therefore, a data of a logic low level is sensed by the comparison unit 520. Also, if the data of a logic low level is loaded onto the input line BL, the voltage level of the input line BL is lowered, and the current sinking unit 502 then decreases the amount of current sinking to the ground to make the voltage level of the output line A higher than the reference voltage VREF. Therefore, a data of a logic high level is sensed by the comparison unit 520.

According to the embodiment of the present invention, the logic level of the data of the input line BL and the logic level of the data of the data bus LIO according to a sensing operation are in opposite to each other. Therefore, the logic level of the data may be inverted by an inverter at the end of the data sensing circuit and thus the data may be recognized correctly.

Although FIG. 5 illustrates the data sensing circuit used as a bit line sense amplifier of a memory device, it is obvious to those skilled in the art that the data sensing circuit fabricated according to the exemplary embodiment of the present invention may be used to sense the data inputted to all kinds of input lines.

Also, although FIG. 5 exemplarily illustrates a case where the switching unit 501 and the current sinking unit 502 include NMOS transistors, the switching unit 501 may be substituted with any other device turned on or off in response to a precharge signal and the current sinking unit 502 may be substituted with any other device changing the amount of current flowing therethrough in response to the voltage level of the input line.

According to an embodiment of the present invention, an input line onto which a data is to be loaded is precharged by the same device which senses the loaded data. In this way, the offset features of a sensing device may be addressed and as a result, a data sensing operation may be accurately performed.

Also, since the current source and the comparison unit of a data sensing circuit are shared, the area of the data sensing circuit may be reduced.

While the present invention has been described with respect to the specific embodiments, it will be apparent to those skilled in the art that various changes and modifications may be made without departing from the spirit and scope of the invention as defined in the following claims.

What is claimed is:

1. A data sensing circuit, comprising:
a current source configured to supply a reference current to an output line;
a switching unit configured to couple an input line with the output line during a precharge operation of the input line;
a current sinking unit configured to sink a current from the output line in response to a voltage level of the input line; and
a comparison unit configured to compare a voltage level of the output line with a voltage level of a reference voltage.

2. The data sensing circuit of claim 1, wherein the reference current is supplied from the current source to the output line through a mirroring unit.

3. The data sensing circuit of claim 2, wherein the current source and the comparison unit are shared by a plurality of data sensing circuits.

4. The data sensing circuit of claim 1, wherein the switching unit is a transistor that forms a current path between the input line and the output line in response to a precharge signal, and
the current sinking unit is a transistor that forms a current path between a ground and the output line in response to a voltage level of the input line.

5. The data sensing circuit of claim 1, wherein a data is loaded onto the input line after the precharge operation.

6. A data sensing circuit, comprising:
an input line;
an output line;
a first transistor configured to couple the input line with the output line in response to a precharge signal;
a second transistor configured to have a gate coupled with the input line and form a current path between the output line and a sinking end;
a current source configured to supply a reference current to the output line; and
a comparison unit configured to compare a voltage level of the output line with a voltage level of a reference voltage.

7. The data sensing circuit of claim 6, wherein the first transistor is one of an NMOS transistor or a PMOS transistor, and
the second transistor is one of an NMOS transistor or a PMOS transistor.

8. The data sensing circuit of claim 6, wherein the precharge signal is enabled before a data is loaded onto the input line.

9. A bit line sense amplifier, comprising:
a current source configured to supply a reference current to an output line;
a switching unit configured to couple a bit line with the output line during a precharge operation of the bit line;
a current sinking unit configured to sink a current from the output line in response to a voltage level of the bit line;
a comparison unit configured to compare a voltage level of the output line with a voltage level of a reference voltage and drive a data bus.

10. The bit line sense amplifier of claim 9, wherein the reference current is supplied from the current source to the output line through a mirroring unit.

11. The bit line sense amplifier of claim 9, further comprising:
a refresh operation unit configured to perform a refresh operation onto the bit line in response to the voltage level of the output line.

12. The bit line sense amplifier of claim 9, further comprising:
a write operation unit configured to transfer a data of the data bus to the bit line.

13. A memory device, comprising:
a memory cell;
a bit line onto which a data of the memory cell is loaded;
a current source configured to supply a reference current to an output line;
a switching unit configured to couple the bit line with the output line during a precharge operation of the bit line;
a current sinking unit configured to sink a current from the output line in response to a voltage level of the bit line; and
a comparison unit configured to compare a voltage level of the output line with a voltage level of a reference voltage and drive a data bus.

14. The memory device of claim 13, wherein a data is loaded from the memory cell to the bit line after a precharge operation of the bit line.

15. A data sensing circuit, comprising:
a current source configured to supply a reference current to an output line;
a current sinking unit configured to sink a current from the output line in response to a voltage level of the input line;
a comparison unit configured to compare a voltage level of the output line with a voltage level of a reference voltage and drive a data bus; and
a switching unit configured to transfer a voltage of the data bus to the input line during a precharge operation of the input line.

16. The data sensing circuit of claim 15, wherein the reference current is supplied from the current source to the output line through a mirroring unit.

17. The data sensing circuit of claim 15, wherein the data is loaded onto the input line after the precharge operation.

* * * * *